(12) United States Patent
Chin et al.

(10) Patent No.: US 7,953,134 B2
(45) Date of Patent: May 31, 2011

(54) SEMICONDUCTOR LIGHT-EMITTING DEVICE

(75) Inventors: Ming-Ta Chin, Hsinchu (TW);
Kuo-Feng Huang, Hsinchu (TW);
Ping-Fei Shen, Hsinchu (TW);
Ching-Jen Wang, Hsinchu (TW);
Shih-Pang Chang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 134 days.

(21) Appl. No.: 12/347,392

(22) Filed: Dec. 31, 2008

(65) Prior Publication Data

US 2010/0166033 A1    Jul. 1, 2010

(51) Int. Cl.
*H01S 5/00* (2006.01)
(52) U.S. Cl. ............... 372/45.012; 372/43.01; 372/39; 372/45.01
(58) Field of Classification Search ............ 372/43.01, 372/45.01, 45.012
See application file for complete search history.

(56) References Cited

U.S. PATENT DOCUMENTS

| 4,881,238 A | 11/1989 | Chinone et al. |
| 7,244,964 B2 | 7/2007 | Hata |
| 7,420,261 B2 * | 9/2008 | Dwiliński et al. ............ 257/615 |
| 2006/0065886 A1 * | 3/2006 | Shi et al. ........................ 257/13 |

FOREIGN PATENT DOCUMENTS

TW    I282636    6/2007

\* cited by examiner

*Primary Examiner* — Dung T Nguyen
(74) *Attorney, Agent, or Firm* — Finnegan, Henderson, Farabow, Garrett & Dunner, LLP

(57) ABSTRACT

A semiconductor light-emitting device includes a substrate, a first cladding layer over the substrate, an active region on the first cladding layer, and a second cladding layer on the active region, wherein the active region includes a first type barrier layer that is doped and a second type barrier layer that is undoped, the first type barrier layer being closer to the first cladding layer than the second type barrier layer.

13 Claims, 3 Drawing Sheets

SEMICONDUCTOR LIGHT-EMITTING DEVICE

TECHNOLOGY FIELD

The present invention relates to a semiconductor device, and more particularly, to a semiconductor light-emitting device.

BACKGROUND

Semiconductor light-emitting devices, for example, semiconductor light-emitting diodes and semiconductor laser diodes, have been widely used in various applications, such as display, illumination, and communication. An operational process that takes place in a semiconductor light-emitting device is radiative recombination between electrons and holes in an active region. This recombination generates photons, some of which can escape from the body of the device, to constitute output light. A parameter that characterizes a light-emitting device is brightness, which is related to the number of photons emitted within a certain period of time. Different methods, such as increasing the radiative recombination inside the active region, can enhance the brightness of a semiconductor light-emitting device.

Some modern semiconductor light-emitting devices have a quantum-well (QW) structure in the active region, where the thickness of the well is on the order of several nanometers to several tens of nanometers. Control of the thickness is achieved by using state-of-the-art epitaxial technologies such as metal-organic chemical vapor deposition (MOCVD) and molecular beam epitaxy (MBE). Due to the relatively small thickness of the well, a quantum confinement effect of carriers (both electrons and holes) occurs in the well, which leads to better device performance. However, a single quantum well may not capture all the injected carriers, especially when a large amount of carriers are injected. This limits output power and hence the brightness of a semiconductor light-emitting device. Accordingly, instead of a single-quantum-well active region, a multi-quantum-well (MQW) active region may instead be provided in high-power, high-brightness semiconductor light-emitting devices.

In an MQW semiconductor light-emitting device, the active region consists of a plurality of quantum well layers separated by barrier layers interposed therebetween. An n-type cladding layer is placed at one side of the active region and a p-type cladding layer is placed at the other side of the active region. Electrons and holes are injected into the active region from the n-type cladding layer and the p-type cladding layer, respectively. In the active region, electrons and holes move in opposite directions and may recombine with each other when they reach the same quantum well. Therefore, the electron density is high near the n-type cladding layer and decreases gradually away from the n-type cladding layer. Similarly, the hole density is high near the p-type cladding layer and decreases gradually away from the p-type cladding layer. The decrease of hole density can be more rapid as compared to that of electron density, because the mobility and diffusion coefficient of holes may be smaller than those of electrons. Accordingly, more radiative recombination occurs in quantum wells close to the p-type cladding layer and less in quantum wells close to the n-type cladding layer. When the number of quantum wells is large, e.g., several tens of quantum wells, the situation becomes more severe. The result is, near the n-cladding layer, a lot of injected electrons may not recombine radiatively with holes and may be wasted via other recombination channels.

In some cases, the above-mentioned problem may be alleviated to a certain extent if the p-type cladding layer is heavily doped. This is because the p-type impurities may be highly diffusive. Even if the p-type impurities are only incorporated during the growth of the p-type cladding layer, they may diffuse into the active region. P-type impurities diffused into the active region may provide additional holes during device operation and enhance the brightness of the device to a certain extent. However, this may not completely solve the above-mentioned problem since, when there are too many quantum wells, the p-type impurities may not be able to diffuse across the entire active region and the wells close to the n-type cladding layer may still lack holes that can recombine radiatively with electrons. Therefore, the brightness of a semiconductor light-emitting device can not be further enhanced. In addition, the p-type impurities diffusing into the active region may exist not only in the barriers but also in the wells and hence form non-radiative recombination centers in the wells. These non-radiative recombination centers may consume part of injected carriers and may be harmful to enhancing the brightness of a device.

SUMMARY

In accordance with the present invention, there is provided a semiconductor device including a substrate, a first cladding layer over the substrate, an active region on the first cladding layer, and a second cladding layer on the active region, wherein the active region includes a first type barrier layer that is doped and a second type barrier layer that is undoped, the first type barrier layer being closer to the first cladding layer than the second type barrier layer.

Also in accordance with the present invention, there is provided a semiconductor device including a permanent substrate, a bonding layer over the permanent substrate, a second cladding layer on the bonding layer, an active region on the second cladding layer, and a first cladding layer on the active region, wherein the active region includes a first type barrier layer that is doped and a second type barrier layer that is undoped, the first type barrier layer being closer to the first cladding layer than the second type barrier layer.

Features and advantages consistent with the invention will be set forth in part in the description which follows, and in part will be obvious from the description, or may be learned by practice of the invention. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the invention include a semiconductor light-emitting device having a higher radiative recombination probability of carriers in the active region, and hence having enhanced brightness.

Hereinafter, embodiments consistent with the present invention will be described with reference to drawings. Wherever possible, the same reference numbers will be used throughout the drawings to refer to the same or like parts.

Figure 1:
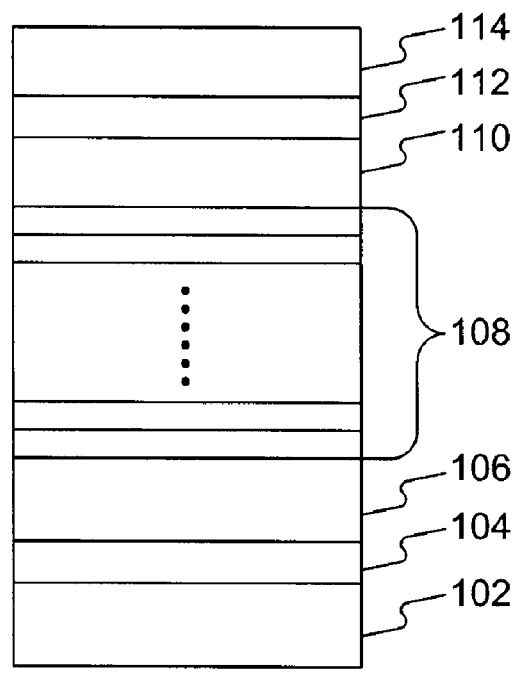
FIG. 1 is a view illustrating the structure of a semiconductor light-emitting device according to a first embodiment.
Figure 2:
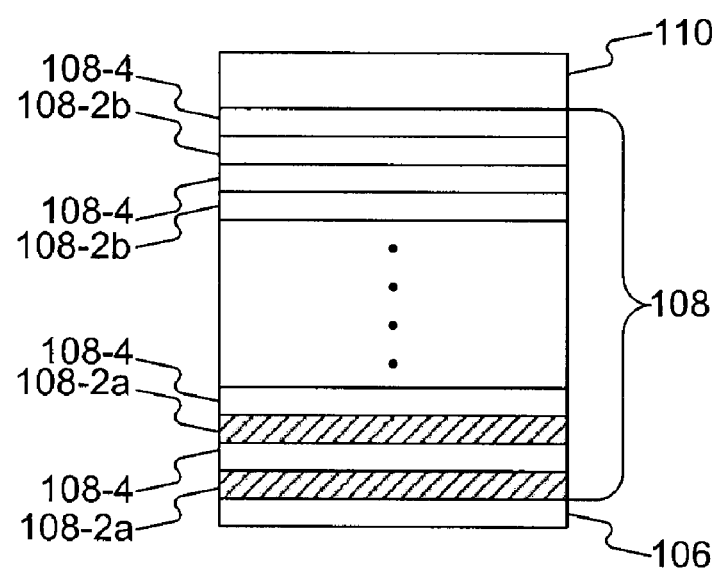
FIG. 2 is an enlarged view illustrating details of an active region of the semiconductor light-emitting device according to the first embodiment.

FIGS. 1 and 2 illustrate a structure of a semiconductor light-emitting device 100 according to a first embodiment. The semiconductor light-emitting device 100 includes a plurality of semiconductor layers stacked successively on a substrate 102. Layers of the device may be grown using any ordinary semiconductor material growth method familiar to those skilled in the art, such as metal-organic chemical vapor deposition (MOCVD). In such case, substrate 102 may be referred to as a growth substrate. In an MOCVD system, the substrate surface is heated. Precursors for different elements are flowed over the substrate and react with each other on the heated substrate surface to form epitaxial layers. The substrate 102 may be, for example, a GaAs substrate with an n-type conductivity. On the substrate 102 is a buffer layer 104 with a first conductivity type. The buffer layer 104 is provided to, for example, compensate the lattice difference between the substrate 102 and the structure grown on it and/or block the extension of possible defects such as dislocations from the substrate 102 into the device grown on top of it. The buffer layer 104 may be, for example, a GaAs buffer layer with an n-type conductivity. The semiconductor light-emitting device 100 also includes a first cladding layer 106 with a first conductivity type and a second cladding layer 110 with a second conductivity type. The first cladding layer 106 is on the buffer layer 104 and may be, for example, an AlInP, AlGaInP or AlGaAs cladding layer with an n-type conductivity. The second cladding layer 110 may be, for example, an AlInP, AlGaInP or AlGaAs cladding layer with a p-type conductivity. A multi-quantum-well (MQW) active region 108 is sandwiched between the first cladding layer 106 and the second cladding layer 110. The materials forming the active region 108 have a smaller bandgap energy as compared to those of the first cladding layer 106 and the second cladding layer 110. A multi-layer structure having a second conductivity type is formed on the second cladding layer 110. The multi-layer structure may include, for example, a transition layer 112 and a current spreading layer 114 formed on the transition layer 112. The transition layer 112 may be provided as, for example, a p-type InGaP layer. The current spreading layer 114 may be provided as, for example, a p-type GaP layer. The transition layer 112 compensates the lattice difference between the current spreading layer 114 and the second cladding layer 110.

FIG. 2 is an enlarged view of a portion of the semiconductor light-emitting device 100 illustrated in FIG. 1, showing details of the structure of the MQW active region 108. The MQW active region 108 includes a plurality of quantum well layers 108-4 with a plurality of barrier layers 108-2, including barrier layers 108-2a and 108-2b, interposed therebetween, forming a plurality of well-layer/barrier-layer pairs. There may be, for example, several to several tens or even more than one hundred well-layer/barrier-layer pairs in the MQW active region 108. The MQW active region 108 may include semiconductor materials such as $(Al_xGa_{1-x})_yIn_{1-y}P$ ($0 \leq x \leq 1$, $0 \leq y \leq 1$), or may include AlGaAs, InGaP, or other alternative materials. In the MQW active region 108, the material forming the wells has a bandgap energy smaller than that of the material forming the barriers, so that carriers may be captured and trapped in the wells. For example, the wells and the barriers may be formed by $(Al_xGa_{1-x})_yIn_{1-y}P$ ($0 \leq x \leq 1$, $0 \leq y \leq 1$) materials with different x and/or y values selected to achieve desired bandgap energies.

In the first embodiment, some of the barrier layers 108-2, which are labeled 108-2a, are doped with second-conductivity-type impurities. The barrier layers 108-2a may be doped, for example, to be p-type. Other barrier layers 108-2b are undoped. The doped barrier layers 108-2a are closer to the first cladding layer 106 than the undoped barrier layers 108-2b. The number of doped barrier layers 108-2a may be equal to or smaller than one half of the total number of barrier layers 108-2. The p-type impurities incorporated in doped barrier layers 108-2a may be of one or more kinds selected from a group of elements, which are capable of providing holes, including, but not limited to, magnesium (Mg), zinc (Zn), beryllium (Be), and carbon (C). The impurity concentration may be selected from a range between $1 \times 10^{16}$ cm$^{-3}$ and $1 \times 10^{20}$ cm$^{-3}$. The impurity concentration in the doped barrier layers 108-2a should be sufficiently high to provide enough holes to neighboring wells. However, if the impurity concentration is too high, crystal perfection and hence performance of the semiconductor light-emitting device may be adversely affected, with the result that the brightness of the device may not be sufficiently enhanced. Therefore, the impurity concentration is selected to achieve a desired device performance. Adjusting impurity concentration during fabrication of the device 100 may be realized by, for example, changing the flow rate of the precursor for the doping impurities during growth of the doped barrier layers 108-2a. As an example, the appropriate impurity concentration of doped barrier layers 108-2a for the semiconductor light-emitting device 100 according to the first embodiment may be between $1 \times 10^{16}$ cm$^{-3}$ and $1 \times 10^{20}$ cm$^{-3}$, and doped with p-type impurity, such as magnesium (Mg), zinc (Zn), beryllium (Be), or carbon (C).

Further, consistent with embodiments of the present invention, although the doped barrier layers 108-2a have the same conductivity type as the second cladding layer 110, for example, both having p-type conductivity, impurities incorporated in the doped barrier layers 108-2a and those incorporated in the second cladding layer 110 may be of different kinds of elements. For example, impurities doped in the doped barrier layers 108-2a may be Zn, while those doped in the second cladding layer 110 may be Mg.

During operation of the semiconductor light-emitting device 100, carriers having different conductivity types are injected from the first cladding layer 106 and the second cladding layer 110, respectively, into the MQW active region 108. For example, electrons may be injected from the n-type cladding layer 106 and holes may be injected from the p-type cladding layer 110. Carriers (both electrons and holes) injected into the MQW active region 108 can be further captured into the wells 108-4 and recombine radiatively in the wells 108-4 to generate photons and hence output light. Wells that are close to the p-type cladding layer 110 can receive enough holes from the p-type cladding layer 110, thus achieving high radiative recombination probability between electrons and holes. For wells that are close to the n-type cladding layer 106, although they may not be able to receive enough holes from the p-type cladding layer 110, the p-type impurities doped in neighboring barriers 108-2a may provide additional holes for the radiative recombination with electrons in these wells. Therefore, high radiative recombination probability in all quantum wells in the MQW active region 108 can be achieved in the semiconductor light-emitting device 100 according to one first embodiment and the brightness of the device can be enhanced.

Figure 3:
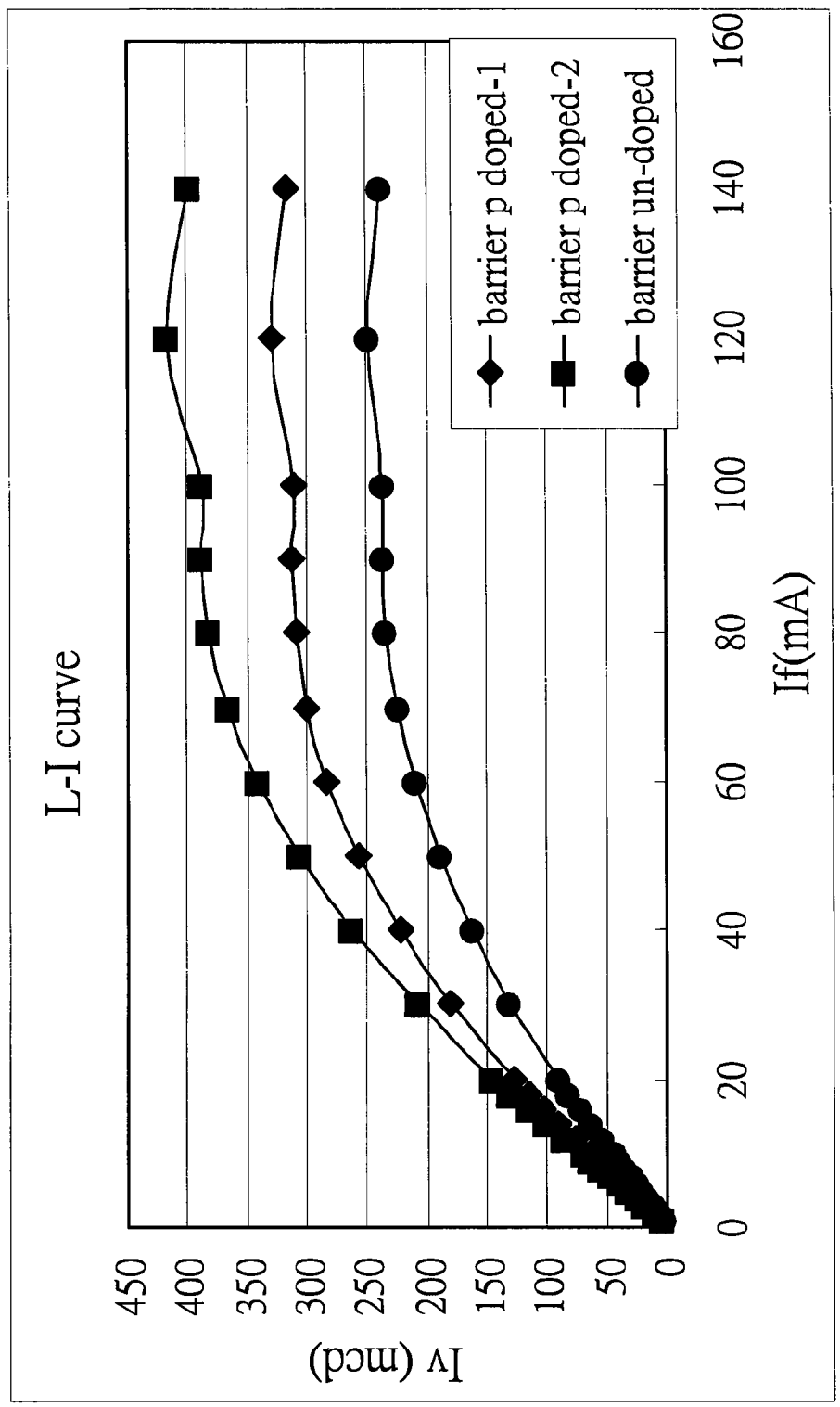
FIG. 3 is a graphical representation of light-current curves of semiconductor light-emitting devices with and without doped active region.

FIG. 3 is a graphical representation of light-current (L-I) curves based on test results of three semiconductor light-emitting devices each having an MQW active region. The horizontal axis indicates a forward current ($I_f$) measured in milliampere (mA) and the vertical axis indicates a luminous intensity value ($I_V$, a measure of brightness) of the device measured in millicandela (mcd). The two curves with square and diamond symbols respectively show the results of two devices with some of the barrier layers in the active region being doped with p-type impurities. The curve with square symbols represents the results of a device having doped barrier layers with a first impurity concentration in the active region, and the curve with diamond symbols represents the results of a device having doped barrier layers with a second impurity concentration in the active region, where the first impurity concentration is higher than the second impurity concentration. The curve with circular symbols represents the results of a device with no doping of the barrier layers in the active region. As seen from this figure, doping in some of the barrier layers in the active region significantly increased the output light and hence enhanced the brightness of a semiconductor light-emitting device.

According to a second embodiment, there is provided a semiconductor light-emitting device with enhanced brightness. The semiconductor light-emitting device according to the second embodiment differs from that according to the first embodiment in that, the first cladding layer 106 has a thickness greater than 1 micron, and is therefore able to provide enough carriers of first conductivity type to the active region. The material used for each layer and other aspects of the semiconductor light-emitting device according to the second embodiment are the same as those of the semiconductor light-emitting device according to the first embodiment.

According to a third embodiment, there is provided a semiconductor light-emitting device with enhanced brightness. The semiconductor light-emitting device according to the third embodiment differs from that according to the first embodiment in that, all the barrier layers in the MQW active region are doped with, for example, p-type impurities. The material used for each layer and other aspects of the semiconductor light-emitting device according to the third embodiment are the same as those of the semiconductor light-emitting device according to the first embodiment.

Figure 4:
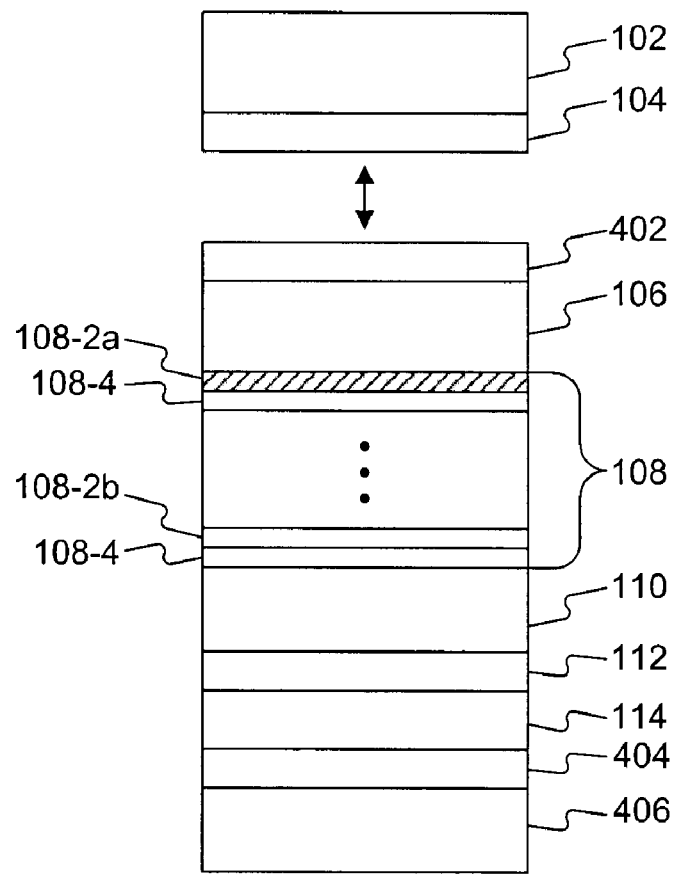
FIG. 4 is a view illustrating the structure of a semiconductor light-emitting device according to a fourth embodiment.

FIG. 4 illustrates a semiconductor light-emitting device 400 with enhanced brightness according to a fourth embodiment. The structure of the semiconductor light-emitting device 400 differs from the device 100 according to the first embodiment in that the substrate 102 and the buffer layer 104 are removed after the device is bonded to a permanent substrate 406 through a bonding layer 404. The bonding layer 404 is provided between the current spreading layer 114 and the permanent substrate 406. Light-emitting device 400 further includes an etching stop layer 402 between the buffer layer 104 and the first cladding layer 106. After bonding, the substrate 102 and the buffer layer 104 are removed. The etching stop layer 402 is provided for protecting the first cladding layer 106 from being damaged while removing the substrate 102 and the buffer layer 104 by known processes like etching or grinding. The material of the etching stop layer 402 can be, for example, n-type InGaP layer. The bonding layer 404 mainly bonds the permanent substrate 406 with the current spreading layer 114. The material of the bonding layer 404 may be, for example, transparent conductive oxide, semiconductor, organic material, or metal. The permanent substrate 406 may be transparent, or thermally or electrically conductive, depending on the performance requirement of the device. Other aspects of the semiconductor light-emitting device according to the fourth embodiment are the same as those of the semiconductor light-emitting device 100 according to the first embodiment.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate;
    a first cladding layer over said substrate;
    an active region on said first cladding layer; and
    a second cladding layer on said active region,
    wherein said active region includes:
        a first type barrier layer that is doped to have a same conductivity type as said second cladding layer, and
        a second type barrier layer that is undoped, and
    wherein said first type barrier layer is closer to said first cladding layer than said second type barrier layer.

2. The semiconductor device of claim 1, further comprising a buffer layer positioned between said substrate and said first cladding layer.

3. The semiconductor device of claim 1, wherein said active region has a multi-quantum-well (MQW) structure including a plurality of well-layer/barrier-layer pairs, wherein a well layer of each said well-layer/barrier-layer pair serves as an active layer in which carriers may recombine radiatively to generate photons.

4. The semiconductor device of claim 3, wherein the barrier layer of each well-layer/barrier-layer pair is one of said first type barrier layers or one of said second type barrier layers, and a number of said first type barrier layers is equal to or smaller than one half of a total number of said first type and second type barrier layers.

5. The semiconductor device of claim 3, wherein the barrier layer of each said well-layer/barrier-layer pair closer to said first cladding layer is one of said first type barrier layers and the barrier layer of each said well-layer/barrier-layer pair closer to said second cladding layer is one of said second type barrier layers.

6. The semiconductor device of claim 3, wherein said active region is formed of one of $(Al_xGa_{1-x})_yIn_{1-y}P$ ($0 \leq x \leq 1$, $0 \leq y \leq 1$), AlGaAs, or InGaP.

7. The semiconductor device of claim 2, wherein said semiconductor substrate is an n-type GaAs substrate, said buffer layer is an n-type GaAs buffer layer, said first cladding layer is an n-type AlInP, AlGaInP, or AlGaAs cladding layer, said second cladding layer is a p-type AlInP, AlGaInP, or AlGaAs cladding layer, and said first type barrier layer is doped p-type.

8. The semiconductor device of claim 7, wherein a thickness of said n-type cladding layer is greater than 1 μm.

9. The semiconductor device of claim 7, wherein p-type impurities doped in said first type barrier layer and said second cladding layer are of one or more selected from a group of p-type doping elements capable of providing holes and including magnesium (Mg), zinc (Zn), beryllium (Be), and carbon (C).

10. The semiconductor device of claim 9, wherein impurities doped in said first type barrier layer and in said second cladding layer are of respectively different elements.

11. The semiconductor device of claim 7, wherein an impurity concentration in said first type barrier layer is in a range between $1\times10^{16}$ cm$^{-3}$ and $1\times10^{20}$ cm$^{-3}$.

12. The semiconductor device of claim 7, further comprising a transition layer on said p-type cladding layer and a current spreading layer on said transition layer.

13. The semiconductor device of claim 12, wherein said transition layer is a p-type InGaP layer, and said current spreading layer is a p-type GaP layer.

* * * * *